(12) United States Patent
Masunari

(10) Patent No.: US 10,236,124 B2
(45) Date of Patent: Mar. 19, 2019

(54) ELECTRONIC COMPONENT MOUNT STRUCTURE, ELECTRONIC COMPONENT, AND METHOD FOR MANUFACTURING ELECTRONIC COMPONENT

(71) Applicant: Murata Manufacturing Co., Ltd., Nagaokakyo-shi, Kyoto-fu (JP)

(72) Inventor: Akio Masunari, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/447,274

(22) Filed: Mar. 2, 2017

(65) Prior Publication Data

US 2017/0256359 A1 Sep. 7, 2017

(30) Foreign Application Priority Data

Mar. 4, 2016 (JP) .................................. 2016-042692

(51) Int. Cl.
*H01G 4/30* (2006.01)
*H01G 4/005* (2006.01)
(Continued)

(52) U.S. Cl.
CPC ............... *H01G 4/30* (2013.01); *H01G 4/005* (2013.01); *H01G 4/12* (2013.01); *H01G 4/232* (2013.01);
(Continued)

(58) Field of Classification Search
CPC ............ H01G 4/30; H01G 4/005; H01G 4/12; H01G 4/232; H01G 4/248; H05K 1/11;
(Continued)

(56) References Cited

U.S. PATENT DOCUMENTS 9,214,278 B2* 12/2015 Park ..................... H05K 3/3442
9,424,990 B2* 8/2016 Lee .......................... H01G 4/30
(Continued)

FOREIGN PATENT DOCUMENTS

| JP | 2007-266208 A | 10/2007 |
| JP | 2015-188111 A | 10/2015 |
| JP | 2015-228482 A | 12/2015 |

OTHER PUBLICATIONS

Official Communication issued in corresponding Japanese Patent Application No. 2016-042692, dated Jul. 3, 2018.

*Primary Examiner* — Timothy J Thompson
*Assistant Examiner* — Michael F McAllister
(74) *Attorney, Agent, or Firm* — Keating & Bennett, LLP

(57) ABSTRACT

An electronic component mount structure includes an electronic component and a mount substrate. The electronic component includes a multilayer body including dielectric layers, internal electrode layers and an insulating layer stacked in a stacking direction. The multilayer body includes two main surfaces opposed to each other in the stacking direction, two side surfaces opposed to each other in a width direction perpendicular to the stacking direction, and two end surfaces opposed to each other in a length direction perpendicular to the stacking and width directions. An insulator is provided on the side surfaces of the multilayer body. The mount substrate includes a land electrode on a mount surface. The electronic component is mounted on the land electrode with a solder fillet being interposed such that the side surfaces are perpendicular to the mount surface. The land electrode is smaller in the width direction than the electronic component.

8 Claims, 12 Drawing Sheets

(51) Int. Cl.
    *H01G 4/12*     (2006.01)
    *H01G 4/232*    (2006.01)
    *H01G 4/248*    (2006.01)
    *H05K 1/11*     (2006.01)
    *H05K 1/18*     (2006.01)
    *H05K 3/34*     (2006.01)

(52) U.S. Cl.
    CPC .............. *H01G 4/248* (2013.01); *H05K 1/11* (2013.01); *H05K 1/181* (2013.01); *H05K 3/3442* (2013.01); *H05K 2201/10015* (2013.01); *H05K 2201/10636* (2013.01); *H05K 2203/048* (2013.01)

(58) Field of Classification Search
    CPC .............. H05K 1/181; H05K 3/3442; H05K 2201/10015; H05K 2201/10636; H05K 2203/048
    USPC ....................................................... 174/260
    See application file for complete search history.

(56) References Cited

U.S. PATENT DOCUMENTS

| | | | |
|---|---|---|---|
| 9,576,732 B2 * | 2/2017 | Lee ........................ | H01G 4/30 |
| 2007/0227649 A1 | 10/2007 | Onodera et al. | |
| 2012/0152604 A1 * | 6/2012 | Ahn ....................... | H01G 2/065 |
| | | | 174/260 |
| 2012/0313489 A1 * | 12/2012 | Shirakawa ............ | H01G 4/30 |
| | | | 310/365 |
| 2013/0057112 A1 * | 3/2013 | Shirakawa ............ | H01C 1/148 |
| | | | 310/311 |
| 2014/0124251 A1 * | 5/2014 | Park ....................... | H05K 3/3442 |
| | | | 174/257 |
| 2014/0367152 A1 * | 12/2014 | Lee ........................ | H05K 1/111 |
| | | | 174/260 |
| 2015/0136464 A1 * | 5/2015 | Shimizu ................ | H05K 1/111 |
| | | | 174/260 |
| 2015/0325367 A1 | 11/2015 | Takeuchi et al. | |
| 2017/0154731 A1 * | 6/2017 | Tahara .................. | H01G 4/232 |

* cited by examiner

ELECTRONIC COMPONENT MOUNT STRUCTURE, ELECTRONIC COMPONENT, AND METHOD FOR MANUFACTURING ELECTRONIC COMPONENT

CROSS REFERENCE TO RELATED APPLICATIONS

This application claims the benefit of priority to Japanese Patent Application No. 2016-042692 filed on Mar. 4, 2016. The entire contents of this application are hereby incorporated herein by reference.

BACKGROUND OF THE INVENTION

1. Field of the Invention

The present invention relates to an electronic component mount structure, an electronic component, and a method for manufacturing an electronic component, and particularly relates to a mount structure for an electronic component mounted, for example, on a portable telephone or a digital camera, an electronic component, and a method for manufacturing an electronic component.

2. Description of the Related Art

Japanese Patent Laying-Open No. 2007-266208 discloses a conventional chip-type electronic component. In the chip-type electronic component, an external electrode is formed by applying the external electrode to an end surface of a chip-type element and baking the same. When such a chip-type electronic component is mounted on a mount substrate such as a printed board, for example, solder cream is applied to a land electrode disposed on the mount substrate and the land electrode and the external electrode of the chip-type electronic component are connected to each other with the solder cream being interposed. In this case, the chip-type electronic component is mounted on the land electrode on the mount substrate by mounting the chip-type electronic component on the mount substrate and reflowing solder.

In such a mount structure for a chip-type electronic component, normally, the chip-type electronic component is self-supported owing to surface tension of solder cream. Depending on a condition for mounting, however, as shown, for example, in FIG. 17, solder cream (not shown) is molten on a land electrode 5 disposed on a mount surface 3a of a mount substrate 3 at the time of reflow of the solder cream and a chip-type electronic component 1 may move. Here, a corner portion of an external electrode 7 of chip-type electronic component 1 may come in contact with external electrode 7 of adjacent chip-type electronic component 1. Therefore, in amount structure 9 for such conventional chip-type electronic component 1, a trouble such as short-circuiting may occur between chip-type electronic components.

SUMMARY OF THE INVENTION

Preferred embodiments of the present invention provide an electronic component mount structure free from a trouble such as short-circuiting, an electronic component, and a method for manufacturing an electronic component.

An electronic component mount structure according to a preferred embodiment of the present invention includes an electronic component and a mount substrate. The electronic component includes a multilayer body including a plurality of dielectric layers and a plurality of internal electrode layers and an insulating layer stacked in a stacking direction. The multilayer body includes a first main surface and a second main surface opposed to each other in the stacking direction, a first side surface and a second side surface opposed to each other in a direction of width perpendicular or substantially perpendicular to the stacking direction, and a first end surface and a second end surface opposed to each other in a direction of length perpendicular or substantially perpendicular to the stacking direction and the direction of width, and a first external electrode arranged to cover the first end surface and to extend from the first end surface to cover the first main surface, the second main surface, the first side surface, and the second side surface and a second external electrode arranged to cover the second end surface and to extend from the second end surface to cover the first main surface, the second main surface, the first side surface, and the second side surface. The plurality of internal electrode layers include a first internal electrode layer and a second internal electrode layer, and the first internal electrode layer connected to the first external electrode and the second internal electrode layer connected to the second external electrode are stacked in the stacking direction. The insulating layer is provided on the first side surface of the multilayer body and the second side surface of the multilayer body. The mount substrate includes a substrate main body including a mount surface and a land electrode provided on the mount surface. The electronic component is mounted on the land electrode with a solder fillet being interposed such that the first side surface and the second side surface are perpendicular or substantially perpendicular to the mount surface of the substrate main body. The land electrode is smaller in dimension in the direction of width than the electronic component.

An electronic component mount structure according to a preferred embodiment of the present invention includes an electronic component and a mount substrate. The electronic component includes a multilayer body including a plurality of dielectric layers and a plurality of internal electrode layers and an insulating layer. The multilayer body includes a first main surface and a second main surface opposed to each other in a stacking direction, a first side surface and a second side surface opposed to each other in a direction of width perpendicular or substantially perpendicular to the stacking direction, and a first end surface and a second end surface opposed to each other in a direction of length perpendicular or substantially perpendicular to the stacking direction and the direction of width, and a first external electrode arranged to cover the first end surface and to extend from the first end surface to cover the first main surface, the second main surface, the first side surface, and the second side surface and a second external electrode arranged to cover the second end surface and to extend from the second end surface to cover the first main surface, the second main surface, the first side surface, and the second side surface. The plurality of internal electrode layers include a first internal electrode layer and a second internal electrode layer, and the first internal electrode layer connected to the first external electrode and the second internal electrode layer connected to the second external electrode are stacked in the stacking direction. The insulating layer is provided on the first side surface of the multilayer body and the second side surface of the multilayer body. The mount substrate includes a substrate main body including a mount surface and a land electrode provided on the mount surface. The electronic component is mounted on the land electrode with a solder fillet being interposed such that the first side surface and the second side surface are perpendicular or substantially perpendicular to the mount surface of the substrate main body.

The solder fillet is smaller in dimension in the direction of width than the electronic component.

An electronic component according to a preferred embodiment of the present invention is to be used in the above-described electronic component mount structure, and the electronic component includes a multilayer body including a plurality of dielectric layers and a plurality of internal electrode layers and an insulating layer. The multilayer body includes a first main surface and a second main surface opposed to each other in a stacking direction, a first side surface and a second side surface opposed to each other in a direction of width perpendicular or substantially perpendicular to the stacking direction, and a first end surface and a second end surface opposed to each other in a direction of length perpendicular or substantially perpendicular to the stacking direction and the direction of width, and a first external electrode arranged to cover the first end surface and to extend from the first end surface to cover the first main surface, the second main surface, the first side surface, and the second side surface and a second external electrode arranged to cover the second end surface and to extend from the second end surface to cover the first main surface, the second main surface, the first side surface, and the second side surface. The plurality of internal electrode layers include a first internal electrode layer and a second internal electrode layer, and the first internal electrode layer connected to the first external electrode and the second internal electrode layer connected to the second external electrode are stacked in the stacking direction. On the first side surface and the second side surface of the multilayer body, the insulating layer is provided on a surface of each of the first external electrode and the second external electrode.

In the electronic component, the insulating layer may further include an extended insulating layer extending toward the first main surface of the multilayer body and the second main surface of the multilayer body.

In the electronic component, the insulating layer may further include an extended insulating layer extending toward the first end surface of the multilayer body and the second end surface of the multilayer body.

In the electronic component, the insulating layer may include a ridgeline portion where the first side surface and the first end surface of the multilayer body meet each other, with a ratio occupied by the extended insulating layer in the first end surface being set to about 10% or higher and about 25% or lower, and a ridgeline portion where the second side surface and the second end surface of the multilayer body meet each other, with a ratio occupied by the extended insulating layer in the second end surface being set to about 10% or higher and about 25% or lower.

In the electronic component, the insulating layer may contain any one or more of an epoxy resin, a silicone resin, a fluorine resin, a phenol resin, a urea resin, a melamine resin, an unsaturated polyester resin, barium titanate, alumina, silica, yttria, and zirconia.

A method for manufacturing an electronic component according to a preferred embodiment of the present invention is a method for manufacturing an electronic component included in the above-described electronic component mount structure, and the method includes manufacturing a multilayer body including a plurality of dielectric layers and a plurality of internal electrode layers. The multilayer body includes a first main surface and a second main surface opposed to each other in a stacking direction, a first side surface and a second side surface opposed to each other in a direction of width perpendicular or substantially perpendicular to the stacking direction, and a first end surface and a second end surface opposed to each other in a direction of length perpendicular or substantially perpendicular to the stacking direction and the direction of width, and a first external electrode arranged to cover the first end surface and to extend from the first end surface to cover the first main surface, the second main surface, the first side surface, and the second side surface and a second external electrode arranged to cover the second end surface and to extend from the second end surface to cover the first main surface, the second main surface, the first side surface, and the second side surface. The plurality of internal electrode layers include a first internal electrode layer and a second internal electrode layer, and the first internal electrode layer connected to the first external electrode and the second internal electrode layer connected to the second external electrode are stacked in the stacking direction. The method for manufacturing an electronic component further includes forming an insulating layer on a surface of each of the first external electrode and the second external electrode, on the first side surface and the second side surface of the multilayer body.

According to various preferred embodiments of the present invention, an electronic component mount structure free from a trouble such as short-circuiting, an electronic component, and a method for manufacturing an electronic component can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
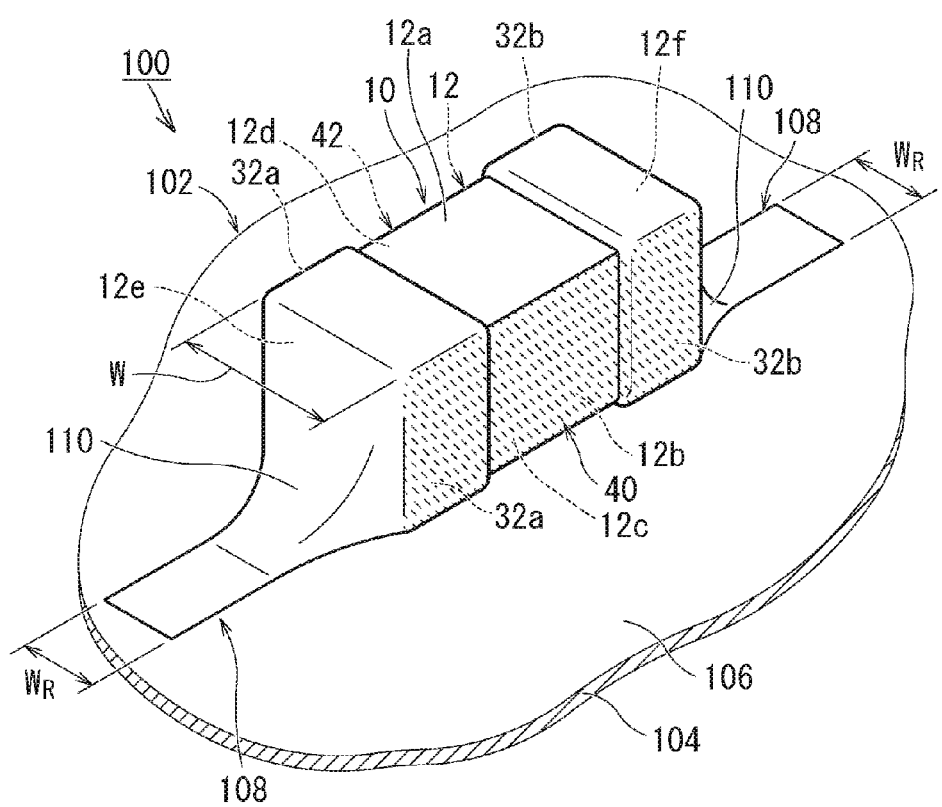
FIG. 1 is a perspective view of a main portion showing one example of a mount structure for a multilayer ceramic capacitor representing one example of an electronic component according to a preferred embodiment of the present invention.
Figure 2:
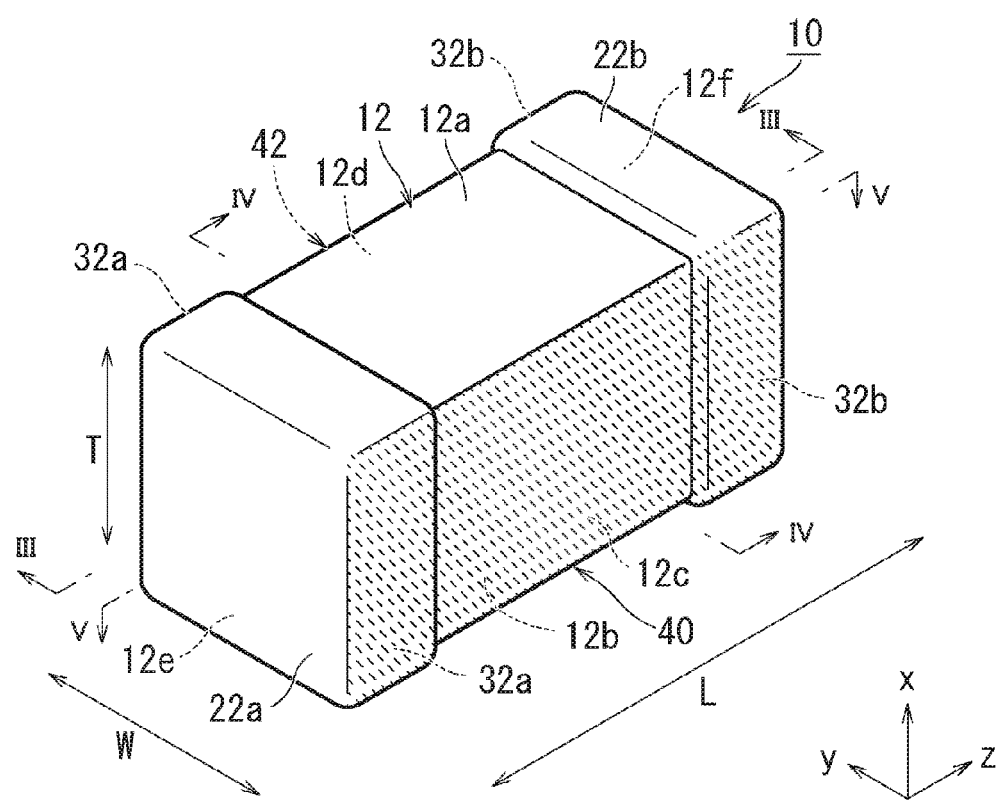
FIG. 2 is a perspective view showing one example of the multilayer ceramic capacitor included in the mount structure shown in FIG. 1.
Figure 3:
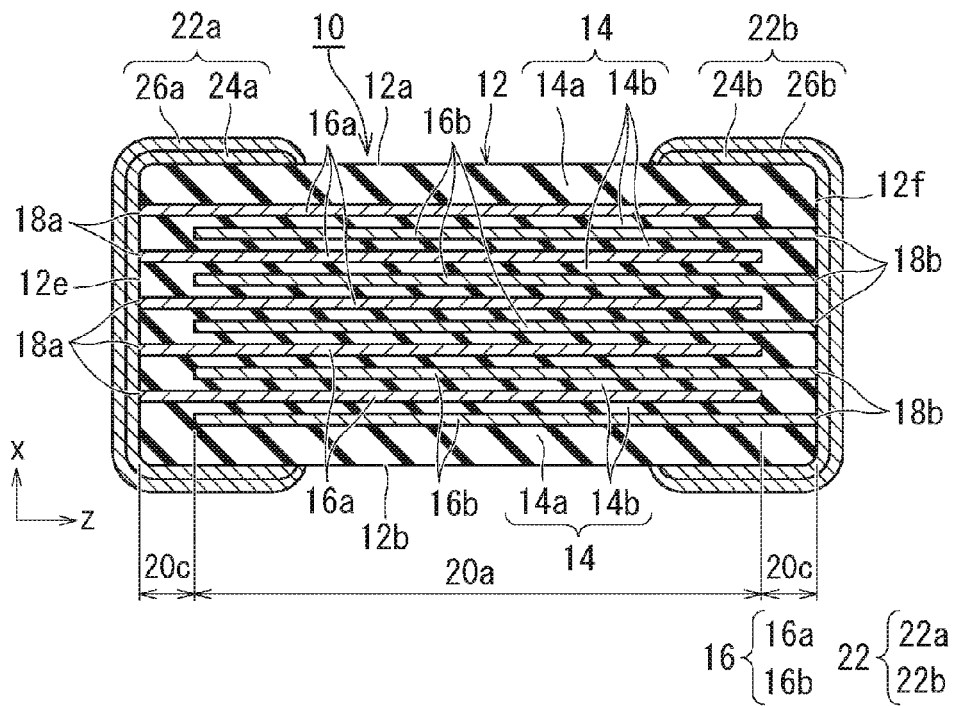
FIG. 3 is a cross-sectional view along the line III-III of the multilayer ceramic capacitor shown in FIG. 2.
Figure 4:
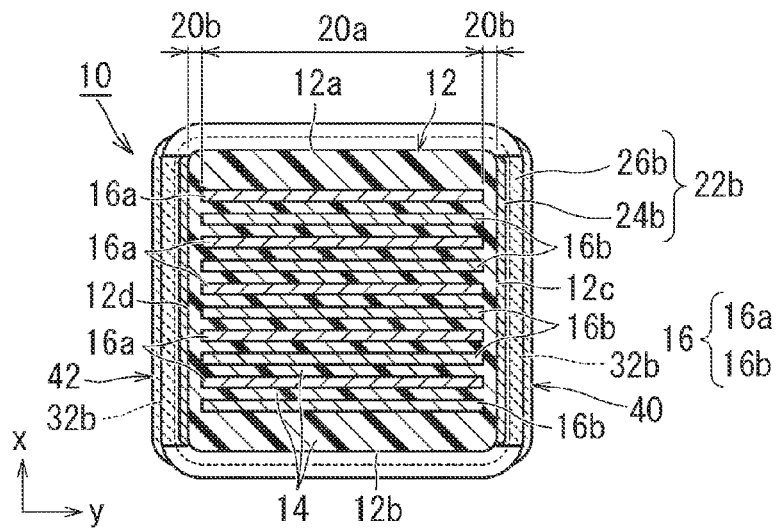
FIG. 4 is a cross-sectional view along the line IV-IV of the multilayer ceramic capacitor shown in FIG. 2.
Figure 5:
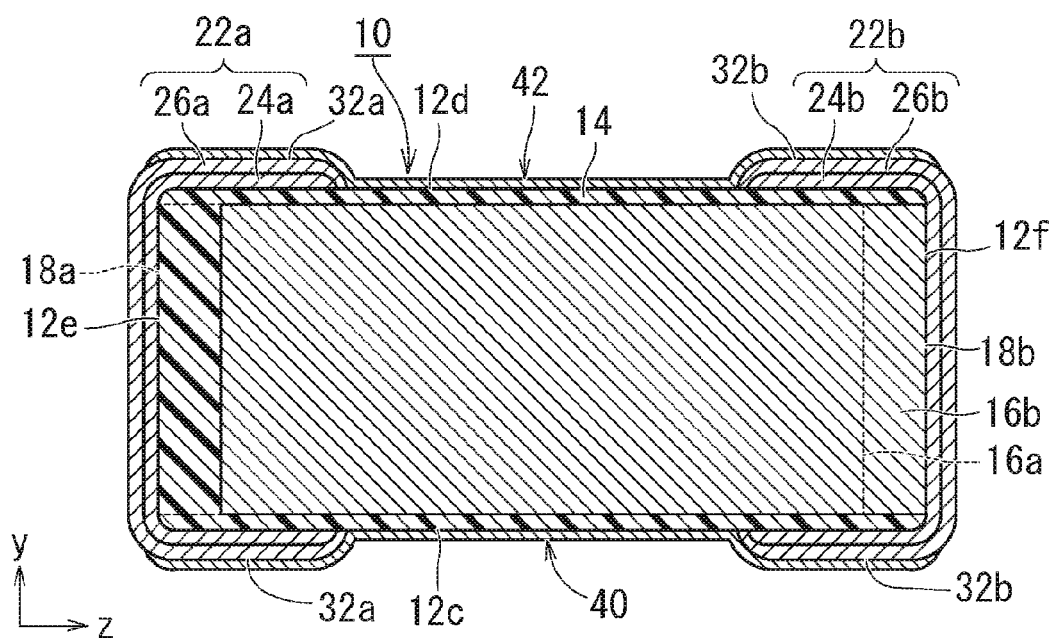
FIG. 5 is a cross-sectional view along the line V-V of the multilayer ceramic capacitor shown in FIG. 2.

FIG. 1 is a perspective view of a main portion showing one example of a mount structure for a multilayer ceramic capacitor representing one example of an electronic component according to this invention. FIG. 2 is a perspective view showing one example of the multilayer ceramic capacitor included in the mount structure shown in FIG. 1. FIG. 3 is a cross-sectional view along the line III-III of the multilayer ceramic capacitor shown in FIG. 2. FIG. 4 is a cross-sectional view along the line IV-IV of the multilayer ceramic capacitor shown in FIG. 2. FIG. 5 is a cross-sectional view along the line V-V of the multilayer ceramic capacitor shown in FIG. 2.

Though preferred embodiments of the present invention mainly relates to an electronic component mount structure, a structure of an electronic component applied to the mount structure and a method for manufacturing the same will initially be described below with reference to FIGS. 2 to 5.

A multilayer ceramic capacitor 10 includes, for example, a multilayer body 12 preferably having a parallelepiped shape as shown, for example, in FIGS. 2 and 3. Multilayer body 12 includes a plurality of dielectric layers 14 and a plurality of internal electrode layers 16 stacked on each other in a stacking direction. Multilayer body 12 includes a first main surface 12a and a second main surface 12b opposed to each other in a stacking direction x, a first side surface 12c and a second side surface 12d opposed to each other in a direction of width y perpendicular or substantially perpendicular to the stacking direction x, and a first end surface 12e and a second end surface 12f opposed to each other in a direction of length z perpendicular or substantially perpendicular to the stacking direction x and the direction of width y. Multilayer body 12 includes a corner portion and a ridgeline portion preferably rounded. The corner portion refers to a portion where three adjacent surfaces of the multilayer body meet one another and the ridgeline portion refers to a portion where two adjacent surfaces of the multilayer body meet each other.

Dielectric ceramics containing such a component as $BaTiO_3$, $CaTiO_3$, $SrTiO_3$, or $CaZrO_3$ can be used as a dielectric material for dielectric layer 14 of multilayer body 12. A material obtained by adding such a compound as an Mn compound, an Fe compound, a Cr compound, a Co compound, or an Ni compound to these components in a range of content lower than a content of a main component may be used. Dielectric layer 14 preferably has a dimension in the stacking direction x preferably, for example, not smaller than about 0.4 μm and not greater than about 1.0 μm.

As shown, for example, in FIG. 3, dielectric layer 14 includes an outer layer portion 14a and an inner layer portion 14b. Outer layer portion 14a is located on each of a side of first main surface 12a and a side of second main surface 12b of multilayer body 12, and it refers to dielectric layer 14 located between first main surface 12a and internal electrode layer 16 closest to first main surface 12a and to dielectric layer 14 located between second main surface 12b and internal electrode layer 16 closest to second main surface 12b. A region lying between these outer layer portions 14a is defined as inner layer portion 14b. Outer layer portion 14a has a dimension in the stacking direction preferably not smaller than about 10 μm and not greater than about 50 μm, for example. Multilayer body 12 preferably has a dimension in a direction of thickness T not smaller than about 100 μm and not greater than about 500 μm, a dimension in a direction of length L not smaller than about 400 μm and not greater than about 1250 μm, and a dimension in a direction of width W not smaller than about 200 μm and not greater than about 550 μm, for example. The number of dielectric layers 14, inclusive of outer layer portions 14a, is preferably, for example, not smaller than 100 and not greater than 1400.

As shown, for example, in FIGS. 3 and 4, multilayer body 12 includes a plurality of first internal electrode layers 16a and a plurality of second internal electrode layers 16b, for example, in a rectangular or substantially rectangular shape as the plurality of internal electrode layers 16. The plurality of first internal electrode layers 16a and the plurality of second internal electrode layers 16b are embedded alternately at an equal or substantially equal interval along the stacking direction x of multilayer body 12.

One end side of first internal electrode layer 16a includes an extracted electrode portion 18a extracted to first end surface 12e of multilayer body 12. One end side of second internal electrode layer 16b has an extracted electrode portion 18b extracted to second end surface 12f of multilayer body 12. Specifically, extracted electrode portion 18a on one end side of first internal electrode layer 16a is exposed at first end surface 12e of multilayer body 12. Extracted electrode portion 18b on one end side of second internal electrode layer 16b is exposed at second end surface 12f of multilayer body 12.

As shown, for example, in FIGS. 3 and 4, multilayer body 12 includes an opposing electrode portion 20a where first internal electrode layer 16a and second internal electrode layer 16b are opposed to each other in inner layer portion 14b of dielectric layer 14. Multilayer body 12 includes a side portion (hereinafter referred to as a "W gap") 20b of multilayer body 12 located between one end of opposing electrode portion 20a in direction of width W and first side surface 12c and between the other end of opposing electrode portion 20a in direction of width W and second side surface 12d. Multilayer body 12 includes an end portion (hereinafter referred to as an "L gap") 20c of multilayer body 12 located between an end portion of first internal electrode layer 16a opposite to extracted electrode portion 18a and second end surface 12f and between an end portion of second internal electrode layer 16b opposite to extracted electrode portion 18b and first end surface 12e. L gap 20c at the end portion of multilayer body 12 preferably has a length preferably not smaller than about 20 µm and not greater than about 40 µm, for example. W gap 20b in the side portion of multilayer body 12 has a length preferably not smaller than about 15 µm and not greater than about 20 µm, for example.

In multilayer body 12, a capacitance is generated as first internal electrode layer 16a and second internal electrode layer 16b are opposed to each other with dielectric layer 14 being interposed in each opposing electrode portion 20a as shown, for example, in FIGS. 3 and 4. Therefore, a capacitance can be obtained between a first external electrode 22a to which first internal electrode layer 16a is connected and a second external electrode 22b to which second internal electrode layer 16b is connected. Therefore, a multilayer ceramic electronic component structured as such defines and functions as a capacitor.

Internal electrode layer 16 contains such a metal as Ni, Cu, Ag, Pd, an Ag—Pd alloy, or Au. Internal electrode layer 16 may further contain dielectric particles based on the same composition as ceramics contained in dielectric layer 14. The number of internal electrode layers 16 is preferably not smaller than 50 and not greater than 750. Internal electrode layer 16 has a thickness preferably not smaller than about 0.2 µm and not greater than about 1 µm, for example.

When piezoelectric ceramics is used for a multilayer body, a multilayer ceramic electronic component defines and functions as a ceramic piezoelectric element. A specific example of a piezoelectric ceramic material includes, for example, a lead zirconate titanate (PZT)-based ceramic material.

When semiconductor ceramics is used for a multilayer body, a multilayer ceramic electronic component defines and functions as a thermistor element. A specific example of a semiconductor ceramic material includes, for example, a spinel-type ceramic material.

When magnetic ceramics is used for a multilayer body, a multilayer ceramic electronic component defines and functions as an inductor element. When the electronic component defines and functions as an inductor element, an internal electrode is formed of a conductor in a form of a coil. A specific example of a magnetic ceramic material includes, for example, a ferrite ceramic material.

An external electrode 22 is provided on a side of first end surface 12e and a side of second end surface 12f of multilayer body 12. External electrode 22 includes first external electrode 22a and second external electrode 22b.

First external electrode 22a is provided on the side of first end surface 12e of multilayer body 12. First external electrode 22a covers first end surface 12e of multilayer body 12 and extends from first end surface 12e to cover a portion of first main surface 12a, second main surface 12b, first side surface 12c, and second side surface 12d. First external electrode 22a is electrically connected to extracted electrode portion 18a of first internal electrode layer 16a.

Second external electrode 22b is provided on the side of second end surface 12f of multilayer body 12. Second external electrode 22b covers second end surface 12f of multilayer body 12 and extends from second end surface 12f to cover a portion of first main surface 12a, second main surface 12b, first side surface 12c, and second side surface 12d. Second external electrode 22b is electrically connected to extracted electrode portion 18b of second internal electrode layer 16b.

As shown in FIG. 3, first external electrode 22a includes an underlying electrode layer 24a and a plated layer 26a sequentially from the side of multilayer body 12. Similarly, second external electrode 22b includes an underlying electrode layer 24b and a plated layer 26b sequentially from the side of multilayer body 12.

Underlying electrode layers 24a and 24b each include at least one selected from among a baked layer, a resin layer, and a thin film layer. The baked layer contains, for example, Si-containing glass and Cu representing a metal. The metal for the baked layer includes, for example, at least one selected from among Cu, Ni, Ag, Pd, an Ag—Pd alloy, and Au. The baked layer is obtained preferably by applying a conductive paste containing glass and a metal to multilayer body 12 and baking the same, and it may be fired simultaneously with internal electrode layer 16 or baked subsequently to firing of dielectric layer 14 and internal electrode layer 16. A plurality of baked layers may be provided. A portion greatest in thickness of the baked layer has a thickness preferably not smaller than about 10 µm and not greater than about 50 µm, for example.

The resin layer may be formed on the baked layer or may directly be formed on multilayer body 12 without forming the baked layer. A plurality of resin layers may be provided. When a resin layer is provided on the baked layer, the resin layer may contain, for example, conductive particles and a thermosetting resin. A portion greatest in thickness of the resin layer has a thickness preferably not smaller than about 5 µm and not greater than about 50 µm, for example.

The thin film layer is formed with a thin film formation method such as sputtering or vapor deposition, and it is a layer not greater than about 1 µm, for example, formed by deposition of metal particles.

For example, at least one selected from among Cu, Ni, Sn, Ag, Pd, an Ag—Pd alloy, and Au is used for plated layers 26a and 26b.

Plated layers 26a and 26b may include a plurality of layers. Preferably, the plated layer has a two-layered structure including an Ni plated layer provided on the baked layer and an Sn plated layer provided on the Ni plated layer. The Ni plated layer is used to prevent erosion of underlying electrode layers 24a and 24b by solder in mount of a multilayer ceramic electronic component, and the Sn plated layer is used to facilitate mounting by improving solderability in mount of a multilayer ceramic electronic component. A single plated layer preferably has a thickness preferably not smaller than about 0.5 µm and not greater than about 5 µm, for example.

When external electrode 22 is formed from a plated layer, external electrode 22 has a plated layer directly provided on multilayer body 12 and directly connected to internal electrode layer 16. In this case, a catalyst may be provided on multilayer body 12 as pre-treatment. The plated layer preferably includes a first plated layer and a second plated layer provided on the first plated layer. The first plated layer and the second plated layer preferably contain plating made of one metal selected from the group consisting, for example, of Cu, Ni, Sn, Pb, Au, Ag, Pd, Bi, and Zn or an alloy containing the metal. For example, when Ni is used for an internal electrode, Cu that is very compatible with Ni is preferably used for the first plated layer. Solderable Sn or Au is preferably used for the second plated layer, and Ni having a solder barrier property is preferably used for the first plated layer.

The second plated layer is formed as necessary and external electrode 22 may include the first plated layer. The second plated layer may be provided as an outermost layer of the plated layer or another plated layer may be provided on the second plated layer. Each plated layer has a thickness preferably not smaller than about 1 μm and not greater than about 10 μm, for example. The plated layer preferably contains no glass. A ratio of a metal per unit volume of the plated layer is preferably, for example, not lower than about 99 volume %, for example. The plated layer is obtained through grain growth along a direction of thickness and it is columnar.

For example, in multilayer ceramic capacitor 10 representing an electronic component according to a preferred embodiment of the present invention, for example, a multilayer ceramic capacitor main body 10A representing a main body of the electronic component is multilayer body 12 including a plurality of dielectric layers 14 and a plurality of internal electrode layers 16 and external electrode 22. In multilayer ceramic capacitor main body 10A, an insulating layer 40 is provided on entire first side surface 12c including first external electrode 22a and second external electrode 22b exposed on the side of first side surface 12c of multilayer body 12. An insulating layer 42 is provided on entire second side surface 12d including first external electrode 22a and second external electrode 22b exposed on the side of second side surface 12d of multilayer body 12. Multilayer ceramic capacitor 10 includes multilayer ceramic capacitor main body 10A, insulating layer 40 provided on the side of first side surface 12c of multilayer body 12, and insulating layer 42 provided on the side of second side surface 12d of multilayer body 12.

Insulating layers 40 and 42 will be described below in detail with reference to FIGS. 1 to 5.

In multilayer ceramic capacitor 10, insulating layer 40 is provided over a surface of a section 32a on the side of first side surface 12c of multilayer body 12 on the surface of first external electrode 22a, first side surface 12c located between first external electrode 22a and second external electrode 22b, and a surface of a section 32b on the side of first side surface 12c of multilayer body 12 on the surface of second external electrode 22b. Insulating layer 42 is provided over a surface of section 32a on the side of second side surface 12d of multilayer body 12 on the surface of first external electrode 22a, second side surface 12d located between first external electrode 22a and second external electrode 22b, and a surface of section 32b on the side of second side surface 12d of multilayer body 12 on the surface of second external electrode 22b.

Insulating layer 40 and insulating layer 42 may each contain any one or more of an epoxy resin, a silicone resin, a fluorine resin, a phenol resin, a urea resin, a melamine resin, an unsaturated polyester resin, barium titanate, alumina, silica, yttria, and zirconia. In this case, a thermosetting epoxy resin, a silicone resin, a fluorine-based resin, a phenol-based resin, a melamine resin, barium titanate, alumina, or silica containing a metal oxide used for a solder resist of a printed board is suitably used.

Insulating layer 40 and insulating layer 42 may each directly be provided on the baked layer or the resin layer. Insulating layer 40 and insulating layer 42 each have a thickness preferably, for example, not smaller than about 0.5 μm and not greater than about 20 μm.

Figure 6:
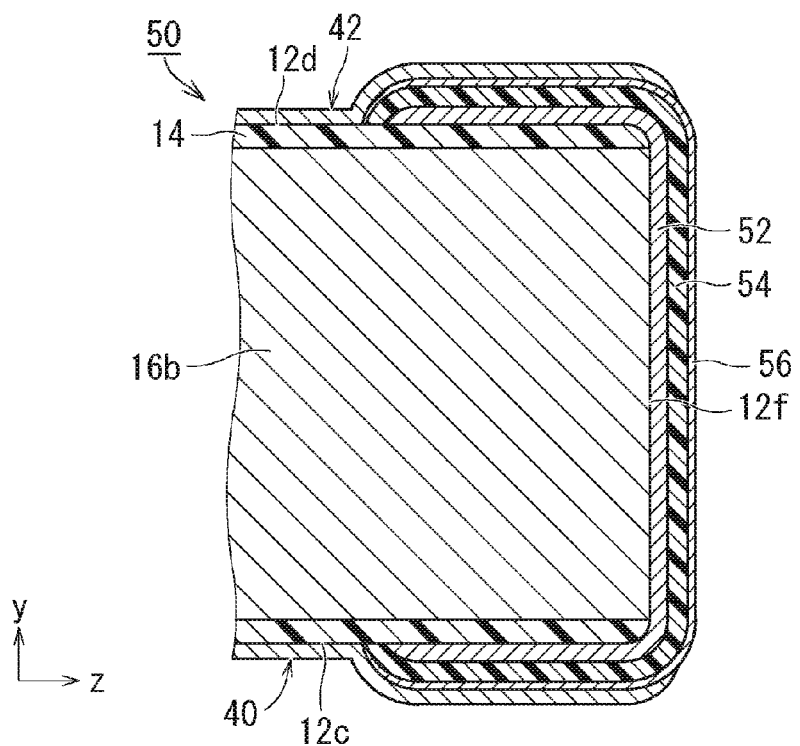
FIG. 6 is an enlarged cross-sectional view of the main portion showing another example of the multilayer ceramic capacitor shown in FIGS. 2 to 5.

FIG. 6 is an enlarged cross-sectional view of the main portion showing another example of the multilayer ceramic capacitor shown in FIGS. 2 to 5. In this case, FIG. 6 is an enlarged cross-sectional view of the main portion corresponding to the cross-sectional view along the line V-V of the multilayer ceramic capacitor shown in FIG. 2.

A multilayer ceramic capacitor 50 shown in FIG. 6 is different from multilayer ceramic capacitor 10 shown in FIGS. 2 to 5 in particular in the structure of external electrode 22. In particular, for example, in multilayer ceramic capacitor 10 shown in FIG. 5, external electrode 22 includes an underlying electrode layer and a plated layer sequentially from the side of multilayer body 12, whereas multilayer ceramic capacitor 50 shown in FIG. 6 has an underlying electrode layer 52, a conductive resin layer 54, and a plated layer 56 sequentially from the side of multilayer body 12.

In multilayer ceramic capacitor 10, as shown, for example, in FIG. 2, relation between dimensions and the number of layers is shown in Table 1 below, with L representing a dimension in the direction of length of multilayer ceramic capacitor 10 including multilayer body 12, first external electrode 22a, and second external electrode 22b, W representing a dimension in the direction of width of multilayer ceramic capacitor 10, and T representing a dimension in the stacking direction of multilayer ceramic capacitor 10. Each dimension includes a tolerance of about ±10%, for example. A dimension of multilayer ceramic capacitor 10 can be measured with a micrometer or an optical microscope.

TABLE 1

| No. | L Dimension | W Dimension | T Dimension | The Number of Dielectric Layers |
| --- | --- | --- | --- | --- |
| 1 | 0.4 mm | 0.2 mm | 0.2 mm | 100 to 330 |
| 2 | 0.6 mm | 0.3 mm | 0.3 mm | 150 to 500 |
| 3 | 0.8 mm | 0.4 mm | 0.4 mm | 200 to 660 |
| 4 | 0.8 mm | 0.5 mm | 0.5 mm | 250 to 830 |
| 5 | 1.0 mm | 0.5 mm | 0.5 mm | 250 to 830 |
| 6 | 0.4 mm | 0.2 mm | 0.4 mm | 200 to 660 |
| 7 | 0.6 mm | 0.3 mm | 0.6 mm | 300 to 1000 |
| 8 | 0.8 mm | 0.4 mm | 0.8 mm | 400 to 1330 |
| 9 | 0.8 mm | 0.5 mm | 0.8 mm | 400 to 1330 |
| 10 | 1.0 mm | 0.5 mm | 0.8 mm | 400 to 1330 |

An average thickness of each of the plurality of dielectric layers and the plurality of internal electrode layers described above is measured as below. Initially, multilayer ceramic capacitor 10 is polished to expose a cross-section including direction of length L and direction of thickness T of multilayer body 12 (hereinafter referred to as an "LT cross-section"). By observing the LT cross-section with a scanning electronic microscope, a thickness of each portion is determined. In this case, thicknesses on five lines in total are measured, the lines being a centerline along direction of thickness T which passes through the center of the cross-section of multilayer body 12 and two lines drawn on each of opposing sides of the centerline. An average value of five measurement values is defined as an average thickness of each portion. In order to find a more accurate average thickness, five measurement values are determined for each of an upper portion, a central portion, and a lower portion in direction of thickness T and an average value of the measurement values is defined as an average value for each portion.

A mount structure 100 for multilayer ceramic capacitor 10 will now be described in detail in particular with reference, for example, to FIGS. 1 and 3.

Mount structure 100 for the multilayer ceramic capacitor includes multilayer ceramic capacitor 10 and a mount substrate 102 as shown, for example, in FIG. 1. Mount substrate 102 includes a substrate main body 104. Substrate main body 104 is formed, for example, of a resin such as glass epoxy or ceramics such as glass ceramics. Substrate main body 104 may be formed, for example, of a plurality of insulating layers. One main surface of substrate main body 104 includes a mount surface 106. A land electrode 108, for example, linear in a plan view having a width $W_R$ is disposed on mount surface 106. Multilayer ceramic capacitor 10 is mounted perpendicularly or substantially perpendicularly to mount surface 106 of substrate main body 104. Multilayer ceramic capacitor 10 is mounted in such a manner that first external electrode 22a and second external electrode 22b of multilayer ceramic capacitor 10 and land electrode 108 are connected and fixed to each other, for example, with a solder fillet 110 being interposed. In this case, first external electrode 22a and second external electrode 22b located on the side of second main surface 12b of multilayer body 12 and land electrode 108 are mounted.

In mount structure 100, in particular, a dimension in the direction of width of the land electrode has width $W_R$ smaller than a dimension in direction of width W of multilayer ceramic capacitor 10. Solder fillet 110 has a width substantially within a range of width $W_R$ of land electrode 108. Solder fillet 110 has a width desirably smaller than the dimension in direction of width W of multilayer ceramic capacitor 10. Therefore, in mount structure 100, multilayer ceramic capacitor 10 is less likely to move.

Solder cream preferably does not extend over the side of first side surface 12c and the side of second side surface 12d of multilayer body 12 but rises toward first main surface 12a of multilayer body 12 and wets the same. In this case, adhesion between multilayer ceramic capacitor 10 and land electrode 108 is improved.

In multilayer ceramic capacitor 10 in mount structure 100, insulating layer 40 is provided on the entire surface on the side of first side surface 12c of multilayer body 12 and insulating layer 42 is provided on the entire surface on the side of second side surface 12d of multilayer body 12 as described with reference to FIGS. 2 to 5.

Figure 17:
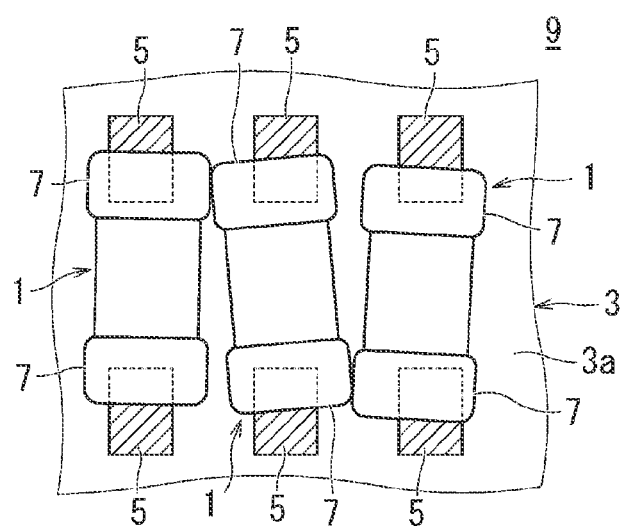
FIG. 17 is a schematic plan view of a main portion showing a problem of amount structure for a conventional chip-type electronic component representing background of this invention.

Therefore, in mounting multilayer ceramic capacitor 10 on mount substrate 102 and reflowing solder, even though adjacently arranged multilayer ceramic capacitor 10 is moved and displaced and first external electrode 22a and/or second external electrode 22b are/is in contact as shown, for example, in FIG. 17, a trouble such as short-circuiting is able to be prevented owing to insulating layers 40 and 42.

One non-limiting example of a process for manufacturing a multilayer ceramic capacitor main body of multilayer ceramic capacitor 10 will now be described.

(1) Initially, a dielectric sheet and a conductive paste for internal electrodes are prepared. The dielectric sheet or the conductive paste for internal electrodes contains a binder and a solvent, and an organic binder or an organic solvent which has been known can be used.

(2) Then, an internal electrode pattern is formed by printing the conductive paste for internal electrodes in a prescribed pattern, for example, through screen printing or gravure printing on the dielectric sheet.

(3) A prescribed number of dielectric sheets for an outer layer not having an internal electrode pattern formed are stacked, dielectric sheets each having an internal electrode formed are successively stacked thereon, and a prescribed number of dielectric sheets for an outer layer are stacked thereon. Thus, a multilayer sheet is fabricated.

(4) A multilayer block is fabricated by pressing the obtained multilayer sheet in a stacking direction with a hydrostatic press, for example.

(5) Then, multilayer chips are cut from the multilayer block by cutting the multilayer block into a prescribed size. Here, a corner portion and a ridgeline portion of the multilayer chip may be rounded through barrel polishing.

(6) Multilayer body 12 is fabricated by firing the multilayer chip. A firing temperature is preferably from about 900° C. to about 1300° C., although depending on a material for a dielectric or internal electrodes.

(7) The conductive paste for external electrodes is applied to opposing end surfaces of obtained multilayer body 12 and baked. Thus, the baked layer of the external electrode is formed. A baking temperature is preferably from about 700° C. to about 900° C., for example.

(8) A surface of the baked layer made of the conductive paste for the external electrodes is plated as necessary.

A plated electrode may be formed directly on the surface of the multilayer body without providing the baked layer. In this case, a step (7) below is performed instead of the step (7) above. After the steps in (1) to (6), (7) opposing end surfaces of obtained multilayer body 12 are plated so that an underlying plated film is formed on exposed portions of the internal electrodes. For plating, any of electrolytic plating and electroless plating may be adopted. Electroless plating is disadvantageous in that pre-treatment with a catalyst is required for improving a rate of segregation of plating and the process is complicated. Therefore, electrolytic plating is normally preferably adopted. Barrel plating is preferably used as a plating technique.

When a surface conductor is formed, a surface conductor pattern is printed on a ceramic green sheet as an outermost layer in advance and the surface conductor pattern may be fired simultaneously with a ceramic body. Alternatively, a surface conductor may be printed on a main surface of the fired ceramic body and then baked.

(8) Then, a plated layer is provided on a surface of the plated electrode for external electrodes as necessary.

An exemplary step of providing an insulating layer to form insulating layers 40 and 42 on multilayer ceramic capacitor main body 10A obtained through the steps above will now be described below with reference to FIGS. 7, 8A, 8B, 9, 10, and 11.

Figure 7:
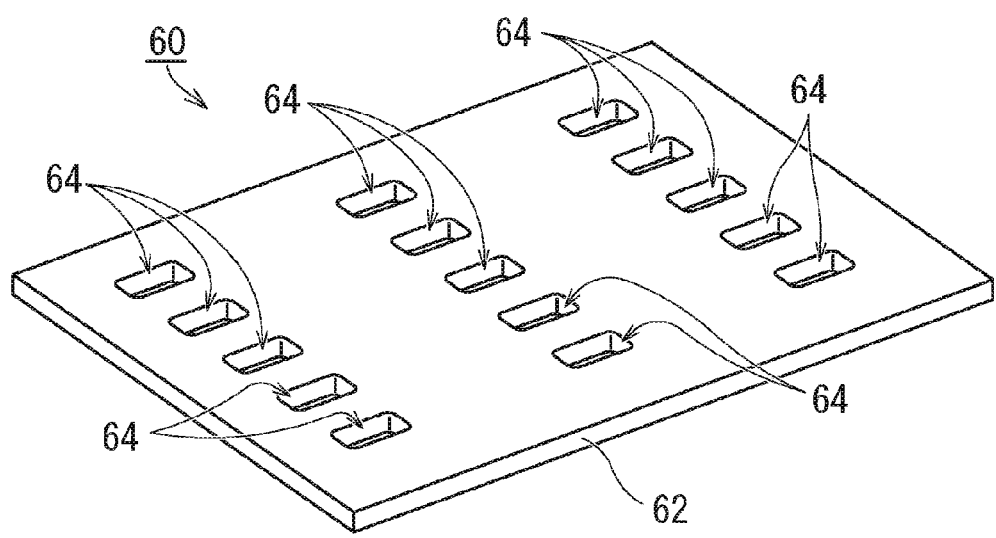
FIG. 7 is a perspective view showing one example of a masking jig used in one example of a method for manufacturing the multilayer ceramic capacitor shown in FIGS. 2 to 5.

[Step 1]: Initially, a masking jig 60 is prepared. Masking jig 60 includes, for example, a mask plate 62 with a rectangular or substantially rectangular shape in a plan view as shown in FIG. 7. Mask plate 62 includes a plurality of through holes 64 which pass from one main surface to the other main surface. Each through hole 64 is rectangular or substantially rectangular in a plan view.

Figure 8A:
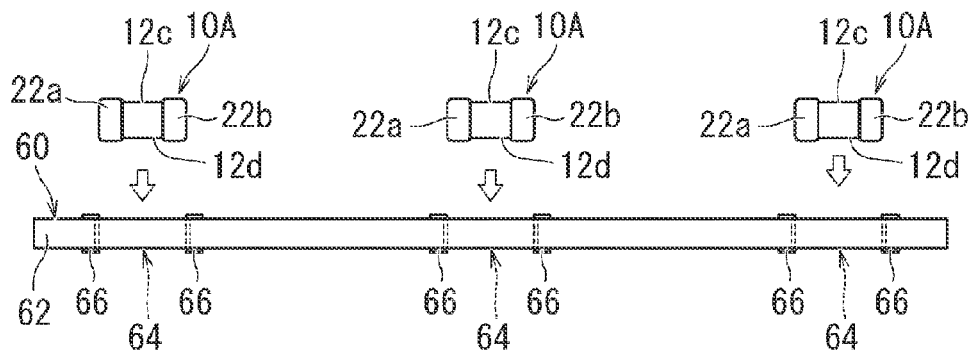
FIGS. 8A and 8B are process charts showing a main portion of one example of the method for manufacturing the multilayer ceramic capacitor shown in FIGS. 2 to 5 and showing a state of holding a main body of the multilayer ceramic capacitor with the masking jig shown in FIG. 7.
Figure 8B:
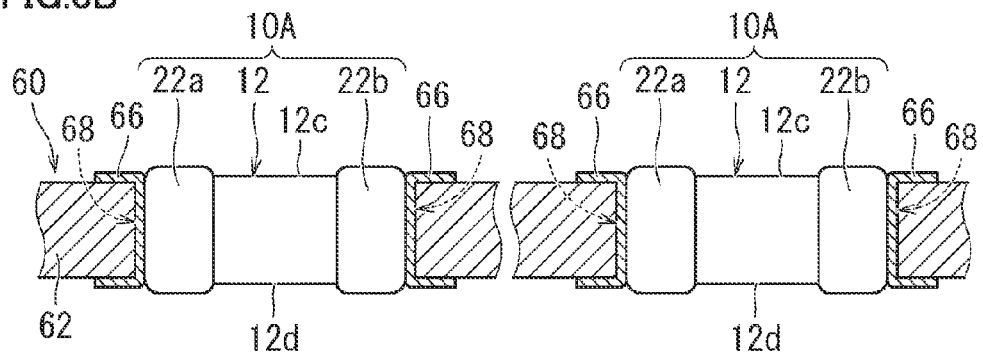

As shown in FIGS. 8A and 8B, a support member 66 having a rectangular or substantially rectangular cross-section with open one side surface is set in each of the plurality of through holes 64. Support member 66 is formed, for example, of an elastic body. Each support member 66 is fitted in each through hole 64. In this case, support member 66 lies between opposing longitudinal end portions of each through hole 64 such that a recessed bottom portion 68 of each support member 66 abuts.

[Step 2]: Then, multilayer ceramic capacitor main body 10A is inserted in each through hole 64 in masking jig 60 as shown in FIGS. 8A and 8B. In this case, each multilayer ceramic capacitor main body 10A is held between support members 66 set between the opposing longitudinal end portions of each through hole 64. Each multilayer ceramic capacitor main body 10A is held between support members 66 substantially in the center of each through hole 64. Entire second side surface 12d including, for example, first external electrode 22a and second external electrode 22b on the side of second side surface 12d of multilayer ceramic capacitor main body 10A is masked by masking jig 60.

Figure 9:
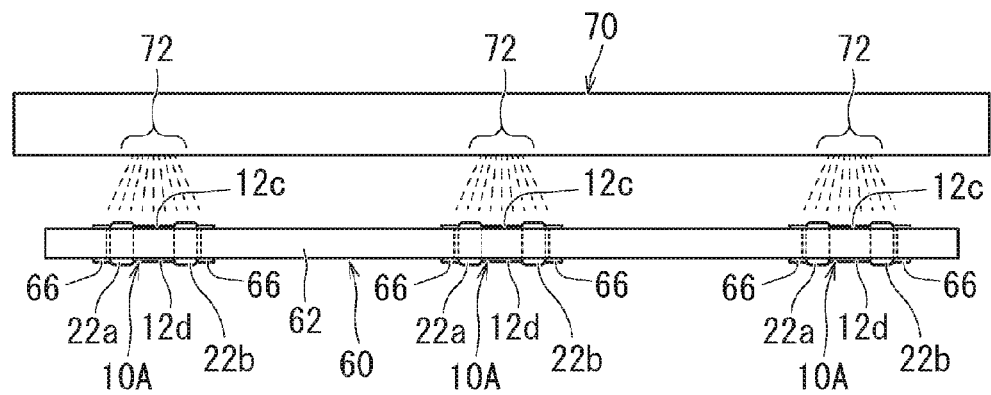
FIG. 9 is a process chart showing another main portion of one example of the method for manufacturing the multilayer ceramic capacitor and showing one example in which an insulating layer is provided on the main body of the multilayer ceramic capacitor.

[Step 3]: Thereafter, as shown in FIG. 9, an insulating material is sprayed from a nozzle portion 72 of a spraying apparatus 70 onto each multilayer ceramic capacitor main body 10A held by masking jig 60. Thus, insulating layer 40 is formed on entire first side surface 12c including first external electrode 22a and second external electrode 22b, for example, on the side of first side surface 12c of multilayer ceramic capacitor main body 10A. With a similar method, insulating layer 42 is formed on entire second side surface 12d including first external electrode 22a and second external electrode 22b on the side of second side surface 12d of multilayer body 12.

Figure 10:
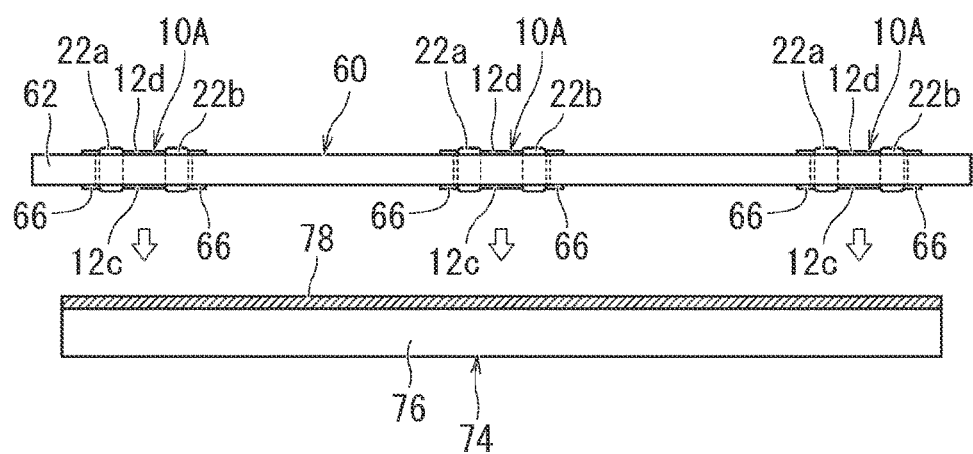
FIG. 10 is a process chart showing a main portion of another example in which an insulating layer is provided on the main body of the multilayer ceramic capacitor.

Instead of the method using spraying apparatus 70 shown in FIG. 9, for example, an immersion apparatus 74 as shown in FIG. 10 may be used to form an insulating layer. Immersion apparatus 74 includes a base member 76. An immersion portion 78 in which insulating materials are formed in layers is disposed on an upper surface of base member 76. In this case, insulating layer 40 is formed by immersing entire first side surface 12c including first external electrode 22a and second external electrode 22b, for example, on the side of first side surface 12c of each multilayer ceramic capacitor main body 10A held by masking jig 60 in immersion portion 78. Insulating layer 42 is formed by immersing entire second side surface 12d including first external electrode 22a and second external electrode 22b, for example, on the side of second side surface 12d of each multilayer ceramic capacitor main body 10A held by masking jig 60 in immersion portion 78.

Figure 11:
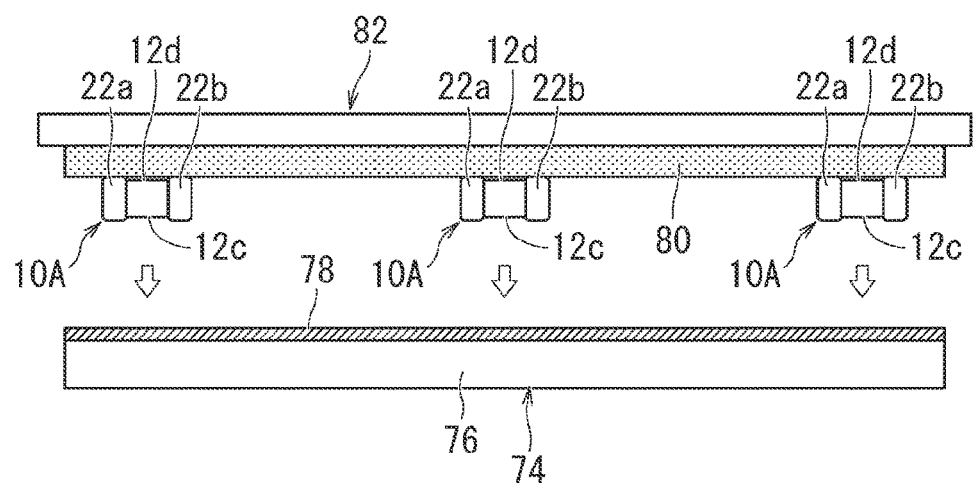
FIG. 11 is a process chart showing a main portion of yet another example in which an insulating layer is provided on the main body of the multilayer ceramic capacitor.

When each multilayer ceramic capacitor main body 10A held by masking jig 60 is immersed in immersion portion 78, each multilayer ceramic capacitor main body 10A may be bonded and held, for example, by a holding member 82 having an adhesive layer 80 on one main surface thereof as shown in FIG. 11, instead of holding each multilayer ceramic capacitor main body 10A with masking jig 60.

An insulating layer may be formed by bonding.

[Step 4]: Then, the insulating layer is secured to multilayer ceramic capacitor main body 10A through thermosetting or drying depending on physical properties of the insulating material. If plating has not yet been performed, a plated layer may be provided after an insulating layer is formed.

Second Preferred Embodiment

Figure 12:
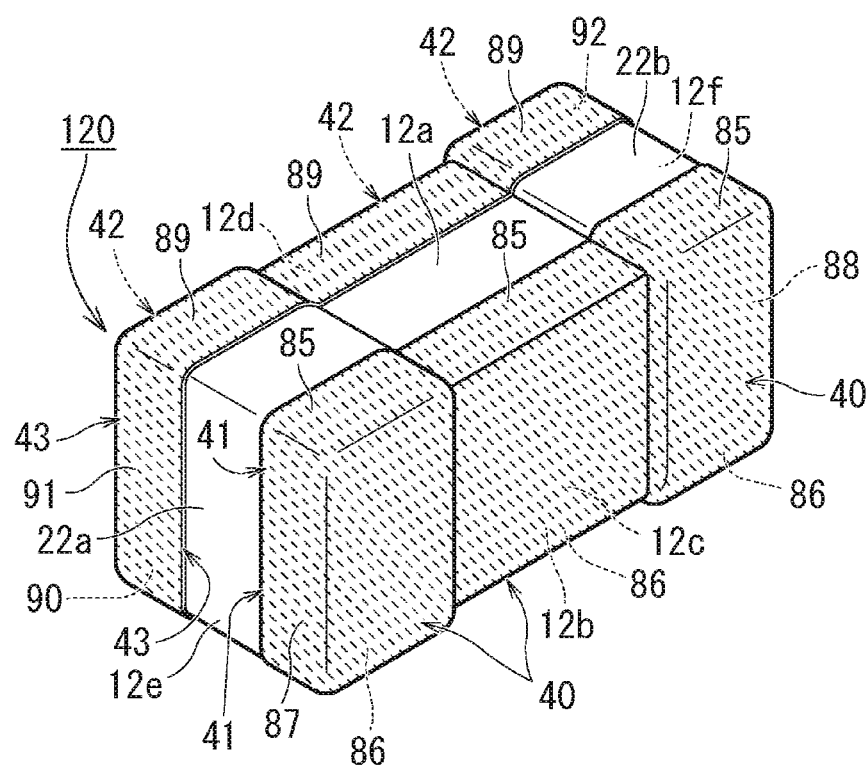
FIG. 12 is a perspective view showing another example of the multilayer ceramic capacitor representing one example of the electronic component included in an electronic component mount structure according to a preferred embodiment of the present invention.
Figure 13:
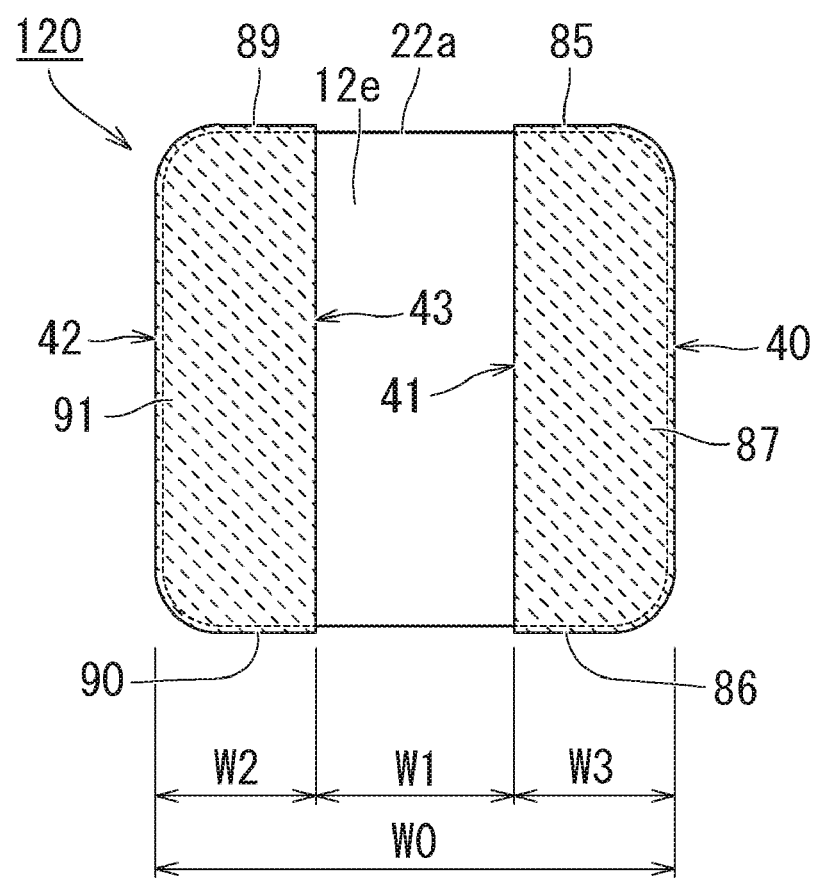
FIG. 13 is a diagram showing an end surface of the multilayer ceramic capacitor shown in FIG. 12.
Figure 14:
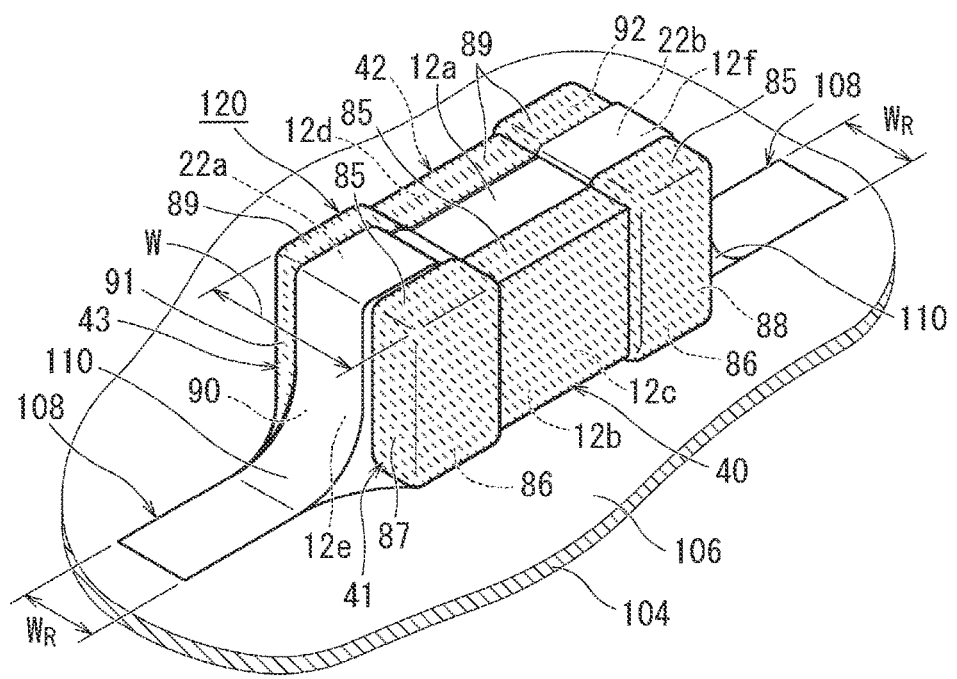
FIG. 14 is a perspective view of a main portion showing one example of the mount structure for the multilayer ceramic capacitor shown in FIG. 12.

FIG. 12 is a perspective view showing another example of the multilayer ceramic capacitor representing one example of the electronic component included in the electronic component mount structure according to this invention. FIG. 13 is a diagram showing an end surface of the multilayer ceramic capacitor shown in FIG. 12. FIG. 14 is a perspective view of a main portion showing one example of the mount structure for the multilayer ceramic capacitor shown in FIG. 12.

A multilayer ceramic capacitor 120 shown in FIG. 12 is different from multilayer ceramic capacitor 10 shown in FIGS. 2 to 5 in particular in that the insulating layer wraps around first main surface 12a, second main surface 12b, first end surface 12e, and second end surface 12f of multilayer body 12.

Insulating layer 40 is provided on the entire surface on the side of first side surface 12c of multilayer body 12 and insulating layer 42 is provided on the entire surface on the side of second side surface 12d of multilayer body 12.

As shown in FIGS. 12 and 13, multilayer ceramic capacitor 120 further includes an extended insulating layer 85 extending from insulating layer 40 toward first main surface 12a of multilayer body 12, an extended insulating layer 86 extending from insulating layer 40 toward second main surface 12b of multilayer body 12, an extended insulating layer 87 extending from insulating layer 40 toward first end surface 12e of multilayer body 12, and an extended insulating layer 88 extending from insulating layer 40 toward second end surface 12f of multilayer body 12.

Multilayer ceramic capacitor 120 further includes an extended insulating layer 89 extending from insulating layer 42 toward first main surface 12a of multilayer body 12, an extended insulating layer 90 extending from insulating layer 42 toward second main surface 12b of multilayer body 12, an extended insulating layer 91 extending from insulating layer 42 toward first end surface 12e of multilayer body 12, and an extended insulating layer 92 extending from insulating layer 42 toward second end surface 12f of multilayer body 12.

Extended insulating layers 85, 86, 87, and 88 define one wrap around portion 41 of insulating layer 40. Extended insulating layers 89, 90, 91, and 92 define another wrap around portion 43 of insulating layer 42. One wrap around portion 41 may include both or any one of a set of extended insulating layers 85 and 86 and a set of extended insulating layers 87 and 88. Similarly, another wrap around portion 43 may include both or any one of a set of extended insulating layers 89 and 90 and a set of extended insulating layers 91 and 92.

As shown, for example, in FIG. 13, there is a prescribed interval W1 in direction of width W of multilayer body 12 between one wrap around portion 41 of insulating layer 40 and another wrap around portion 43 of insulating layer 42.

One wrap around portion 41 includes a ridgeline portion where first side surface 12c and first main surface 12a meet each other, a ridgeline portion where first side surface 12c and second main surface 12b meet each other, a ridgeline portion where first side surface 12c and first end surface 12e meet each other, and a ridgeline portion where first side surface 12c and second end surface 12f meet each other. Another wrap around portion 43 includes a ridgeline portion where second side surface 12d and first main surface 12a meet each other, a ridgeline portion where second side surface 12d and second main surface 12b meet each other, a ridgeline portion where second side surface 12d and first end surface 12e meet each other, and a ridgeline portion where second side surface 12d and second end surface 12f meet each other.

In this case, no insulating layer is located between one wrap around portion 41 of insulating layer 40 and another wrap around portion 43 of insulating layer 42, and a dimension of interval W1 is preferably, for example, not smaller than about 0.3 μm and not greater than about 75 μm.

A total ratio occupied in first main surface 12a, second main surface 12b, first end surface 12e, and second end surface 12f by the insulating layer in wrap around portion 41 and the insulating layer in another wrap around portion 43 which extend from first side surface 12c and second side surface 12d is preferably not lower than about 20% and not higher than about 50%. In this case, an image can be picked up from first end surface 12e and second end surface 12f and the image can be subjected to image processing for measurement.

As shown in FIGS. 12 and 13, in multilayer ceramic capacitor 120, insulating layer 40 includes the ridgeline portion where first side surface 12c and first end surface 12e of multilayer body 12 meet each other, and a ratio occupied in first end surface 12e by wrap around portion 41 extending from first side surface 12c is preferably not lower than about 10% and not higher than about 25%, for example. Insulating layer 42 includes the ridgeline portion where second side surface 12d and first end surface 12e of multilayer body 12 meet each other, and a ratio occupied in first end surface 12e by wrap around portion 43 extending from second side surface 12d is preferably not lower than about 10% and not higher than about 25%, for example.

Multilayer ceramic capacitor 120 in the second preferred embodiment above achieves an effect the same as in the first preferred embodiment above.

Third Preferred Embodiment

Figure 15:
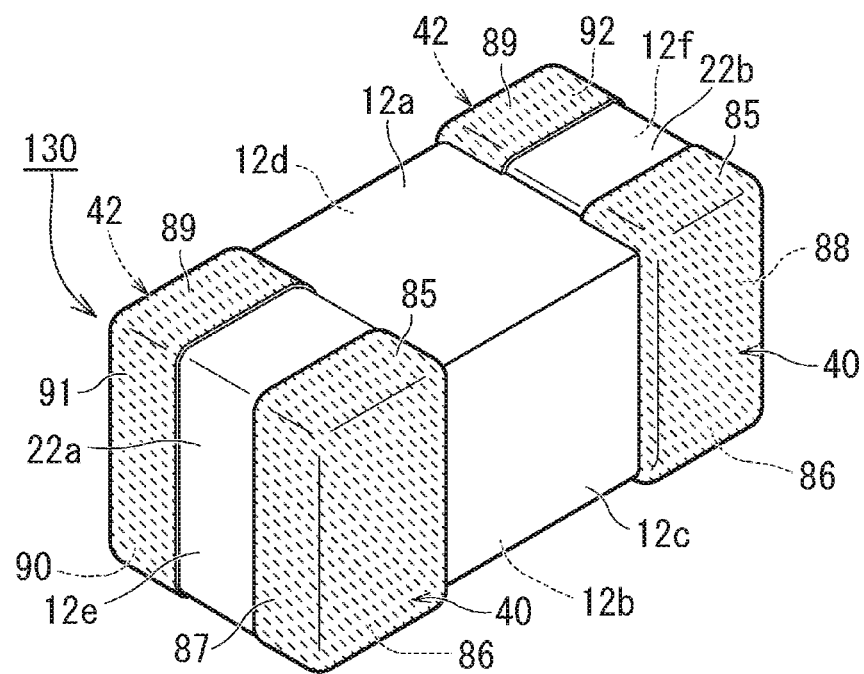
FIG. 15 is a perspective view showing yet another example of the multilayer ceramic capacitor representing one example of the electronic component included in an electronic component mount structure according to a preferred embodiment of the present invention.
Figure 16:
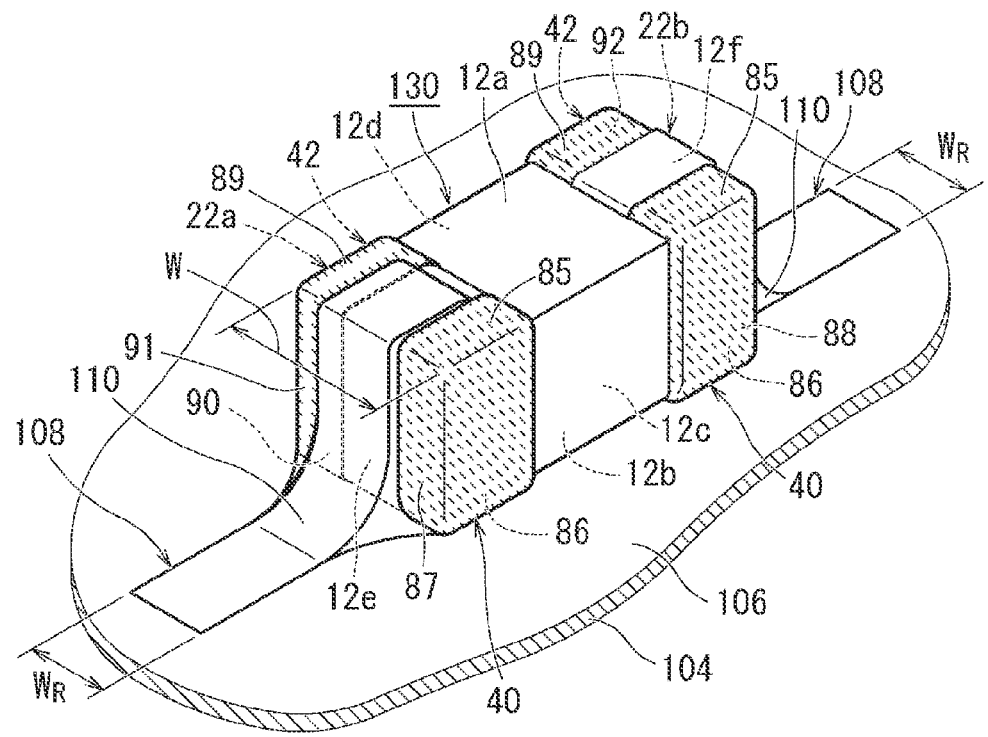
FIG. 16 is a perspective view of a main portion showing one example of the mount structure for the multilayer ceramic capacitor shown in FIG. 15.

FIG. 15 is a perspective view showing yet another example of the multilayer ceramic capacitor representing one example of the electronic component included in the electronic component mount structure according to a preferred embodiment of the present invention. FIG. 16 is a perspective view of a main portion showing one example of the mount structure for the multilayer ceramic capacitor shown in FIG. 15.

A multilayer ceramic capacitor 130 shown in FIG. 15 is different from multilayer ceramic capacitor 120 shown, for example, in FIGS. 12 and 13 in particular in that no insulating layer is provided on first side surface 12c and second side surface 12d of multilayer body 12 located between first external electrode 22a and second external electrode 22b.

In multilayer ceramic capacitor 130, one wrap around portion 41 of insulating layer 40 is provided only on a peripheral surface of first external electrode 22a and another wrap around portion 43 of insulating layer 42 is provided only on a peripheral surface of second external electrode 22b. For example, a plated layer may be provided on a portion where no insulating layer is located, which is, in this case, first side surface 12c and second side surface 12d of multilayer body 12 located between first external electrode 22a and second external electrode 22b.

Multilayer ceramic capacitor 130 according to the third preferred embodiment above achieves advantageous effects that are the same as in the first and second preferred embodiments above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component mount structure comprising: an electronic component; and
a mount substrate; wherein
the electronic component includes:
a multilayer body including a plurality of dielectric layers and a plurality of internal electrode layers stacked in a stacking direction; and
an insulating layer;
the multilayer body includes:
a first main surface and a second main surface opposed to each other in the stacking direction, a first side surface and a second side surface opposed to each other in a direction of width perpendicular or substantially perpendicular to the stacking direction, and a first end surface and a second end surface opposed to each other in a direction of length perpendicular or substantially perpendicular to the stacking direction and the direction of width; and
a first external electrode that covers the first end surface and extends from the first end surface to cover the first main surface, the second main surface, the first side surface, and the second side surface, and a second external electrode that covers the second end surface and extends from the second end surface to cover the first main surface, the second main surface, the first side surface, and the second side surface;
the plurality of internal electrode layers include a first internal electrode layer and a second internal electrode layer;
the first internal electrode layer connected to the first external electrode and the second internal electrode layer connected to the second external electrode are stacked in the stacking direction;
the insulating layer is located on the first side surface of the multilayer body and the second side surface of the multilayer body;
the mount substrate includes a substrate main body including a mount surface and a land electrode located on the mount surface;
the electronic component is mounted on the land electrode with a solder fillet being interposed such that the first side surface and the second side surface are perpendicular or substantially perpendicular to the mount surface of the substrate main body;
the land electrode is smaller in the direction of width than the electronic component;
one of the first and second main surfaces is a mounting surface of the electronic component; and
the solder fillet covers at least a portion of the other one of the first and second main surfaces.

2. The electronic component mount structure according to claim 1, wherein the insulating layer is located on a surface of each of the first external electrode and the second external electrode.

3. The electronic component mount structure according to claim 2, wherein the insulating layer further includes an extended insulating layer extending toward the first main surface of the multilayer body and the second main surface of the multilayer body.

4. The electronic component mount structure according to claim 2, wherein the insulating layer further includes an extended insulating layer extending toward the first end surface of the multilayer body and the second end surface of the multilayer body.

5. The electronic component mount structure according to claim 4, wherein
the insulating layer includes a ridgeline portion where the first side surface and the first end surface of the multilayer body meet each other;
a ratio occupied by the extended insulating layer in the first end surface is about 10% or higher and about 25% or lower;
the insulating layer includes a ridgeline portion where the second side surface and the second end surface of the multilayer body meet each other; and a ratio occupied by the extended insulating layer in the second end surface is about 10% or higher and about 25% or lower.

6. The electronic component mount structure according to claim 2, wherein the insulating layer contains any one or more of an epoxy resin, a silicone resin, a fluorine resin, a phenol resin, a urea resin, a melamine resin, an unsaturated polyester resin, barium titanate, alumina, silica, yttria, and zirconia.

7. A method for manufacturing an electronic component included in the electronic component mount structure according to claim 1, the method comprising:
   forming the multilayer body including the plurality of dielectric layers and the plurality of internal electrode layers stacked in the stacking direction;
   forming the first external electrode to cover the first end surface and to extend from the first end surface to cover the first main surface, the second main surface, the first side surface, and the second side surface;
   forming the second external electrode to cover the second end surface and to extend from the second end surface to cover the first main surface, the second main surface, the first side surface, and the second side surface; wherein
   the plurality of internal electrode layers include the first internal electrode layer and the second internal electrode layer;
   the first internal electrode layer connected to the first external electrode and the second internal electrode layer connected to the second external electrode are stacked in the stacking direction; and
   an insulating layer is formed on a surface of each of the first external electrode and the second external electrode, on the first side surface and the second side surface of the multilayer body.

8. The electronic component mount structure according to claim 1, wherein the solder fillet is smaller in the direction of width than the electronic component.

* * * * *